United States Patent [19]

Keim et al.

[11] Patent Number: 4,656,447
[45] Date of Patent: Apr. 7, 1987

[54] SUPERCONDUCTING FILTER COILS FOR HIGH HOMOGENEITY MAGNETIC FIELD

[75] Inventors: Thomas A. Keim, Clifton Park, N.Y.; Isaak D. Mayergoyz, Rockville, Md.

[73] Assignee: General Electric Company, Schenectady, N.Y.

[21] Appl. No.: 625,076

[22] Filed: Jun. 27, 1984

[51] Int. Cl.[4] ............................................. H01F 7/22
[52] U.S. Cl. ................................... 335/216; 335/299; 324/320
[58] Field of Search ........................ 335/213, 216, 299; 324/318, 319, 320, 322

[56] References Cited

U.S. PATENT DOCUMENTS

| | | | |
|---|---|---|---|
| 3,199,021 | 3/1965 | Anderson | 324/0.5 |
| 3,287,630 | 11/1966 | Gang | 324/5 |
| 3,469,180 | 9/1969 | Anderson | 324/0.5 |
| 3,488,561 | 1/1970 | Anderson | 317/123 |
| 3,569,823 | 3/1971 | Golay | 324/0.5 |
| 3,577,067 | 5/1971 | Weaver | 335/216 X |
| 3,818,396 | 6/1974 | Raphael | 335/216 |
| 4,339,718 | 7/1982 | Bull et al. | 324/319 |
| 4,398,150 | 8/1983 | Barjhoux et al. | 324/319 |
| 4,490,675 | 12/1984 | Knuettel et al. | 324/319 |

FOREIGN PATENT DOCUMENTS

| | | | |
|---|---|---|---|
| 98795 | 8/1978 | Japan | 335/216 |
| 154807 | 9/1982 | Japan | 335/216 |
| 183002 | 11/1982 | Japan | 335/216 |
| 59-18618 | 5/1984 | Japan | 335/299 |
| 0105565 | 4/1984 | Netherlands | 335/299 |
| 2070254 | 9/1981 | United Kingdom | 335/299 |
| 2125632 | 3/1984 | United Kingdom | 335/299 |

OTHER PUBLICATIONS

Anderson, WA "Electrical Current Shims for Correcting Magnetic Fields", *Review of Scientific Instruments*, vol. 32, No. 3, Mar. 1961.

Garrett, MW "Thick Cylindrical Coil Systems for Strong Magnetic Fields With Field or Gradient Homogeneities of the 6th to 20th Order", *Journal of Applied Physics*, vol. 38, No. 6, May 1967.

*Primary Examiner*—George Harris
*Attorney, Agent, or Firm*—Lawrence D. Cutter; James C. Davis; Marvin Snyder

[57] ABSTRACT

When a closed circuit is formed by joining superconducting wires with superconducting joints, the current in that circuit adjusts itself as required to maintain whatever total flux linkage the circuit had at the instant superconductivity was achieved. In particular, a closed circuit which first becomes superconducting under conditions of zero net flux linkage maintains zero net flux linkage as long as the circuit remains superconducting. By appropriately configuring a set of short-circuited superconducting coils, a field inside a volume described by the coils is kept substantially more uniform than it would be if the same volume were magnetized by the same source in the absence of the short-circuited coils. This property is used to insure that the volume within the coils exhibits improved magnetic field homogeneity.

16 Claims, 5 Drawing Figures

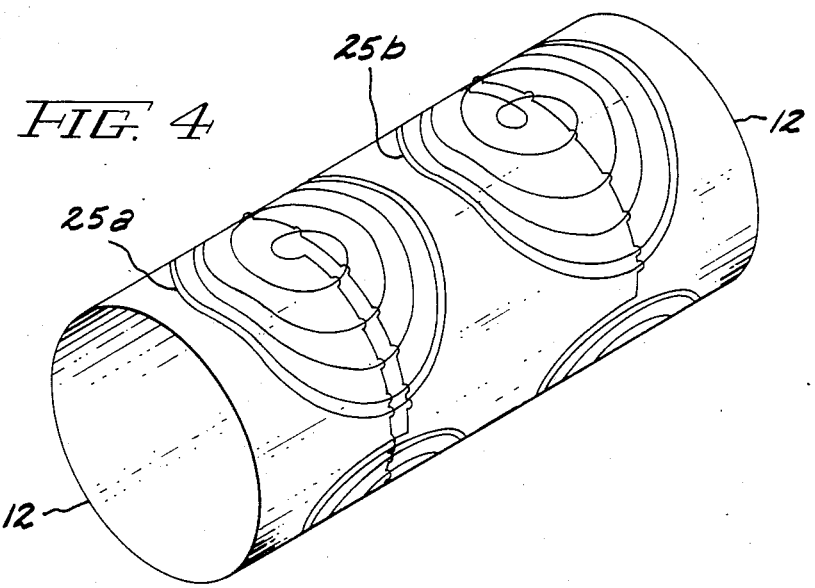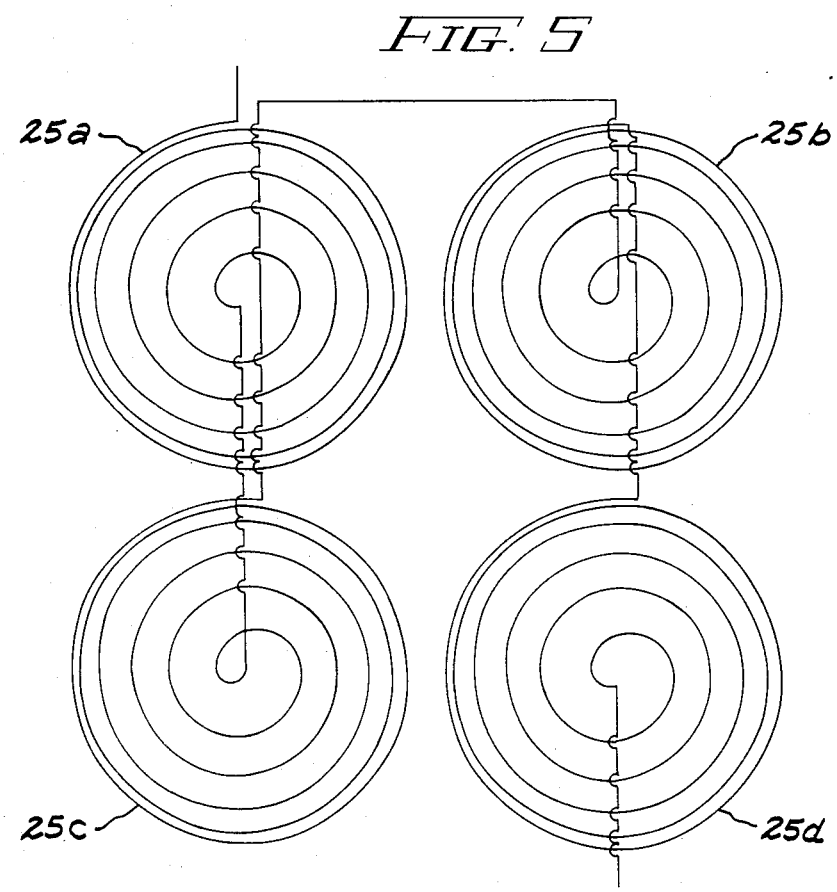

SUPERCONDUCTING FILTER COILS FOR HIGH HOMOGENEITY MAGNETIC FIELD

BACKGROUND OF THE INVENTION

The present invention relates to magnets and similar means for producing highly uniform, high strength magnetic fields. More particularly, the present invention is related to the construction of magnets for producing high homogeneity magnetic fields for use in nuclear magnetic resonance (NMR) imaging systems.

In virtually all NMR applications, it is necessary to provide a spacially constant magnetic field, $B_o$. It is also desirable that the magnetic field comprise an essentially axial component, so that, ideally $B_z=B_o$, where $B_z$ is the component of the magnetic field in the z-axis direction of a conventional cylindrical coordinate system. Likewise, in the ideal situation, it is desired that the radial component $B_p=O$ in the volume of interest. The magnetic field is important since it establishes nuclear spin precession distribution in the subject volume. Subsequent radio frequency radiation from excited nuclei in this volume are employed, under appropriate circumstances, to produce imaging data and spectroscopic chemical information corresponding to physical objects and processes placed within the volume of interest. It has also been recently seen that NMR imaging is particularly applicable to the generation of medical diagnostic images. However, in such applications it has been found that it is particularly desirable to employ a highly uniform magnetic field. It has also been found that the use of superconductive materials for the construction of high strength, high homogeneity magnets is particularly advantageous. In particular, superconductive properties may be exploited to provide magnet coils carrying high, persistent currents, often at a level of between about 1,000 and 2,000 amperes. The use of superconductive materials has permitted the construction of a magnet for NMR imaging which produces a magnetic field of approximately 1.5 Tesla (15,000 gauss). These high field strengths are particularly advantageous in that the signal to noise ratio in the NMR imaging system is improved. Furthermore, it is seen that superconductive magnets do not require the supply of constant power as do conventional resistive magnets. Furthermore, the important properties of field homogeneity and stability can be better maintained with superconductive magnets than with resistively excited magnet devices. Accordingly, it is seen that it is highly desirable to be able to produce high strength, high uniformity magnetic fields.

At present, superconductive magnets employed for NMR imaging also typically employ a set of correction coils for the purpose of achieving greater magnetic field uniformity. One or more sets of these correction coils may be required. The field contribution of a correction coil is designed to be nonuniform, so that in combination with the main magnetic field, the field of the correction coil acts to reduce overall magnetic field non-uniformity. Correction coils are typically designed to carry only a small fraction of the current carried by the main superconductive coils. This is a natural consequence of the fact that the correction coils are only designed for producing small correction fields to counter-balance main coil field non-uniformity. In systems where both the main coils and the correction coils are superconducting, it is sometimes the practice to equip both the main coils and the correction coils with persistent current switches, which are devices which short circuit the coils with an element which is superconductive or resistive at the operator's discretion. When currents in the main coil and all the correction coils have been adjusted to satisfactory levels, the switches can be changed to the superconductive state (persistent mode), and the system of coils thereafter preserves its adjustment until it is intentionally disturbed. It should be kept in mind that high field uniformity is an important aspect of the present invention.

SUMMARY OF THE INVENTION

When a closed circuit is formed by joining superconductive wires with superconductive joints, the current in that circuit adjusts itself as required to maintain whatever total flux linkage the circuit has at the instant superconductivity is achieved. In particular, closed circuits which first become superconducting under conditions of zero net flux linkage, will maintain zero flux linkage as long as the circuit remains superconducting. The present invention takes advantage of these properties by appropriately configuring a set of short circuited superconducting coils to insure that the volume occupied by the coils is provided with a substantially more uniform magnetic field than would otherwise exist if the same volume were magnetized by the same source in the absence of the short circuited superconducting coils.

The fundamental method is to distribute the coils so that individually or collectively, they are coupled only to a specific term or specific terms in a series expansion of the field, and that consequently they act to eliminate the specific term or terms.

The ease with which coils can be selected to satisfy the conditions depends on the suitability of the match between the particular series expansion chosen and the geometry of the coils, but the concept can be used for coils designed to work on a general orthogonal function expansion of the field.

In particular, a preferred embodiment for the present invention comprises a set of main coils disposed substantially on the surface of a cylindrical support and producing a substantially uniform magnetic field within the support volume, together with at least one short circuited superconducting filter coil, disposed substantially on the surface of a cylindrical support and being disposed so as to reduce specific terms in the cylindrical expansion series representing deviation from magnetic field uniformity. In accordance with still another preferred embodiment of the present invention, at least one of the filter coils is wound so that the surface turn density associated with it is given by sinusoidal or cosinusoidal function of the axial distance from the central area of the cylindrical support.

Accordingly, it is seen that an object of the present invention is to provide high strength, high homogeneity magnetic fields.

It is also an object of the present invention to provide magnet systems which are particularly useful for NMR imaging.

It is a still further object of the present invention to provide a means for correcting specific error terms in the cylindrical expansion series representing deviation from magnetic field uniformity.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 4 is an isometric view illustrating a set of transverse saddle coils having turns density distributions which are continuously variable in both the axial and circumferential directions.

FIG. 5 is a flat plan view of the saddle coils of FIG. 4 and their connection prior to their being wrapped onto a cylindrical coil form.

A DETAILED DESCRIPTION OF THE INVENTION

Figure 2:
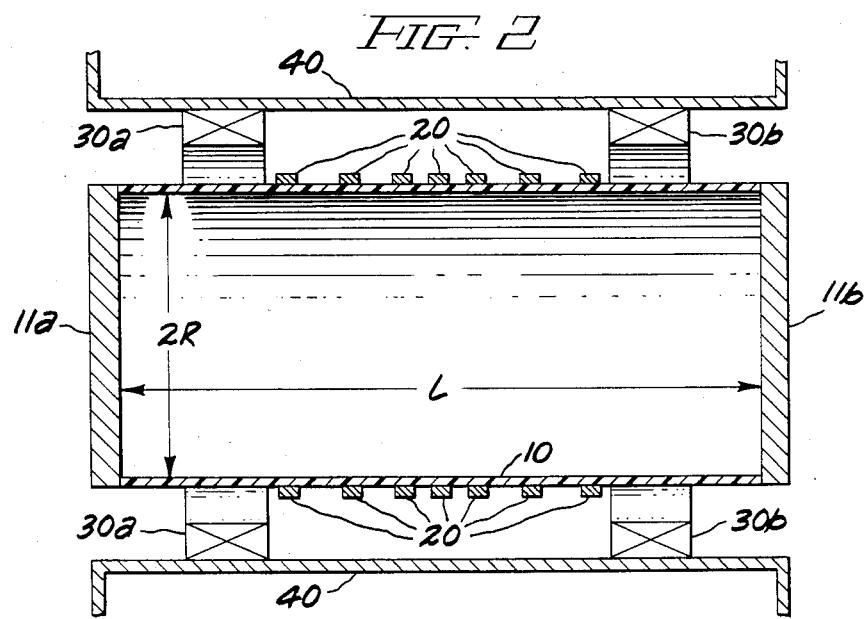
FIG. 2 is a cross-sectional side elevation view illustrating a magnet in accordance with a preferred embodiment of the present invention.

FIG. 2 illustrates a magnet for NMR imaging in accordance with one embodiment of the present invention. Metal end caps 11a and 11b shown in FIG. 2 are illustrated primarily for the purpose of explaining the theoretical development of the present invention. These end caps are not contemplated as generally being present in NMR imaging systems however.

The general principle upon which the present invention is based is that closed loop, or short-circuited superconducting coils operate to preserve the net flux linkage through themselves. Advantage is taken of this property to construct specific coils to modify the magnetic field produced by the main coils in order to provide a more spacially uniform magnetic field. As discussed above, spacial uniformity is highly desirable in NMR imaging systems. The magnet coil assembly of FIG. 2 particularly illustrates the presence of main coils 30a and 30b for providing the greatest contribution to the axially directed magnetic field. Main coils 30a and 30b may or may not, in general, be superconductive. However, it is generally preferred that they are so. Not apparent from FIG. 2 is the fact that the coil assemblies are immersed in a bath of coolant such as liquid helium so as to maintain the superconductive components, particularly coil set 20, below the critical transition temperature, which is typically several degrees Kelvin above the normal boiling temperature of helium for many superconductive alloys. For the purposes of the present invention, coil set 20 is the most relevant aspect of FIG. 2. In particular, coil 20 comprises a superconductive coil disposed in a closed loop, that is, short-circuited condition. While a specific short-circuiting connection is not illustrated in FIG. 2, it is generally understood that such a connection can be made at any convenient location with a super-conductive wire running parallel to the axis of the cylinder. It should also be specifically noted that the axial winding density distribution for coil 20 is not linear. In particular, FIG. 2 illustrates an embodiment of the present invention in which the winding density distribution is (co)sinusoidal. It should also be understood that the superconductive components illustrated in FIG. 2 are typically disposed within a cryostat structure to contain the coolant and to thermally insulate the structure from ambient temperature conditions. However, since the cryostat structures are well known and form no part of the present invention, these structures are not shown in the figures. It should also be understood that, while FIG. 2 illustrates the presence of only a single filter coil on a single cylindrical form, it may be generally desirable to employ several such filter coils on distinct supporting forms. Each such filter coil is designed to eliminate a specific term in an orthogonal function expansion representing deviation of the axial component of the interior magnetic field from spatial uniformity. In the case that multiple forms are employed, they are disposed coaxially. However, the use of a single coil form and a plurality of filter coils disposed thereon is not precluded. It should also be noted that the present invention is not confined to axisymmetric coils but also includes saddle coils, such as those more particularly shown in FIGS. 4 and 5, in which the current distribution is sinusoidal in both the axial and circumferential directions.

In accordance with preferred embodiments of the present invention, the operation of the apparatus shown in FIG. 2 typically takes place in the following manner. Superconductive winding set 20 is made to enter the superconductive state by appropriate cooling. The state transition occurs with zero flux through the area bounded by the windings. This area is seen to be approximately $\pi R^2$. At this point, design current levels are established in the main coils. These coils are preferably superconductive. In accordance with well understood mechanisms this current is established with the use of a persistent current switch which comprises superconductive material which may be switched from the resistive or ohmic state to the superconductive state at the will of the operator. It is however understood that time delays in switching occur as a consequence of the thermal nature of the switch. Such switches are conventionally connected across the main superconductive windings along with a DC current source. Once the desired current level is reached in the main coil the switch is changed to the superconductive state thereby establishing a closed superconducting loop. The power supply may then be removed. It is however to be specifically noted that filter coil 20 of the present invention is itself a short-circuited loop and there is no need to include a persistent current switch in the filter coil circuit. Accordingly, current flowing in coil 20 arises out of its inductive coupling with the magnetic field flux produced by the main coils. Accordingly, since filter coil 20 is designed for carrying corrective currents to improve magnetic field homogeneity, it need not be designed to carry high levels of current.

With these considerations in mind, an analysis of filter coil 20 is now considered, in order to appreciate the particular construction details of filter coils. It should also be born in mind that, while FIG. 2 illustrates the utilization of only a single filter coil, additional filter coils may also be employed to correct particular forms of magnetic field inhomogeneity. These particular forms are described in terms of magnetic field expansion series, as is more particularly described below.

It is widely recognized that a short-circuited superconducting winding will not permit any change in its flux linkage. In particular, if the winding is permitted to become superconducting when it is in a state of zero flux linkage, it maintains zero flux linkage when subsequently exposed to changing fields. It is proposed herein to exploit this fact in order to build systems of correction coils for a magnet so as to automatically achieve very high field uniformity. This concept is referred to herein as the superconducting filter concept.

A set of individual superconducting filter coils is defined herein as a set of coils each of which is coupled to one specific term and consequently acts to eliminate that one term in a series expansion of the imposed field, without effect on the other terms of the expansion. A set of group superconducting filter coils is also defined as a set of n coils which are collectively coupled to only a specific group of n terms in the expansion and consequently act to eliminate those n terms in the imposed field expansion, again without significant effect on other terms in the expansion.

The shim coils of the present invention provide another useful approach. In one embodiment of the present invention, individual spherical harmonics are not eliminated by special separate filter coils, but rather some groups of spherical harmonics are removed together by corresponding sets of superconducting coils. Such superconducting shim coils can be called "group" filters.

The general principle of this design of such "group" superconducting filters can be stated as follows. The filter coils are first cooled below the superconducting transition temperature. The main coils are then energized. As the current is established in the main coils, currents are induced in the "group" filter coils. These induced currents preserve the flux linkage of each filter coil at its initial value of zero. If these filter coils are linked only by a specific group of terms in a series expansion, then the flux linkage of each filter coil is the linear combination of the magnitudes of the terms belonging to this group. Thus, the flux linkage conservation condition mentioned above leads to homogeneous linear equations with respect to the magnitudes of specific terms. If the filter coils are designed in such a way that all these simultaneous equations are linearly independent, then these equations have only a zero solution. It means that all terms belonging to the above group are eliminated.

There are many different ways for practical implementation of the general principle outlined above. One of them can be viewed as follows. It is generally the case that uniformity of one component of the magnetic induction vector (typically the longitudinal (parallel to the z-axis) component) is adequate to insure uniformity of the entire field. This z-component of field generally has deviations from uniformity which are axially symmetric, but which vary in the axial direction. In general the z-field also has components which vary differently, with transverse distance from the z-axis, depending on the transverse direction. So, it is natural to subdivide all spherical harmonics into two groups: (a) transverse spherical (tesseral) harmonics and (b) longitudinal axisymmetric spherical harmonics. Superconducting filter coils maybe designed for these two groups separately.

In the case of transverse tesseral harmonics, saddle-shaped filter coils which are located on cylindrical surfaces parallel to axis z can be used. These coils will not be coupled with the axisymmetric components of magnetic induction.

In the case of longitudinal harmonics of magnetic induction, the filter coils which are located in transverse planes can be used. In order to exclude the coupling of these coils with the main field (zero order harmonic), these coils may comprise two parts. These parts should be disposed in two transverse planes symmetrical to each other with respect to the device center. And, these two parts should be connected by transposed conductors.

It should be emphasized that the superconducting filters can be used not only for elimination of higher order spherical harmonics created by the main coils. They can be also useful for elimination of distortion of the main magnetic field caused by the secondary (reaction) magnetic field due to a ferromagnetic environment. Thus, the application of superconductive filter coils makes NMR imaging magnets less sensitive to the type of environment in which they are installed.

In general many superconductive coil configurations presently employed for correction, if short circuited and exposed to non-uniform magnetic fields, would tend to increase field uniformity in the volume internal to the coil. However, these coils are not in general good examples of superconducting filter coils, particularly as defined above. For example, correction coils presently employed in a 0.5 Tesla magnet are designed to have their dominant effect on one particular term of the spherical harmonic expansion of the axial component of the magnetic field. However, they are intended to do so by injection of current from an external source and not by any induced current action. Additionally, in conventional correction coil system design, attention is usually directed to limiting the interaction amongst the correction coils, and to maximizing their effectiveness in creating the intended harmonic terms rather than on their action as superconducting filter elements. Conventional correction coils designed to eliminate even-ordered terms in the spherical harmonic expansion of the axisymmetric component of the magnetic field, are particularly ineffective in their action as superconducting filters. These even-ordered coils are, as a matter of convenience, designed to be coupled to the main coil. If the main coils are energized after the correction coils are short-circuited, the dominant effect is a reduction in the strength of the main field and a large current induced in the correction coils. These large induced currents in the correction coils can lead to premature quenching of the superconducting current before the rated main magnetic field strength is achieved. Even if the ampere-turn rating of such correction coils is increased to prevent quenching, the resulting second and fourth order fields are much larger than the level of these harmonics in the uncorrected fields.

While field models of magnetic coils have been constructed using the trigonometric Fourier series, it should be understood herein that the term "Fourier series" refers to such series in their generalized form involving expansion in terms of orthogonal functions subject to a mean squared error criterion.

First attempts by the present inventors at describing filter coils were based on spherical harmonic expansion of the fields. This is nearly the universal vehicle of communication among NMR system designers, and therefore appears to be a logical place to start. However, difficulties arise because of the practical engineering constraints which cause many of the coil configurations used in NMR magnet to have strong cylindrical symmetries. If it were possible to wind correction coils on the surface of a sphere, it would be possible to arrive at coil geometries which create and couple to a practical extent only one spherical harmonic. However, in general such construction would be exceedingly difficult and is not seen as desirable under present technology.

Direct transformation of these winding models from a spherical surface to an open finite length cylinder is impossible in a formal sense. Further, attempts at approximately such a transformation may not prove practical in view of the relatively short aspect ratio of the cylindrical surface available for correction coils in a practical NMR magnet. Even if it were possible to devise a suitable set of coils on the surface of the cylinder using this method, the response of a filter coil would be independent of the details of the source of the perturbation only for sources lying entirely outside the sphere defined by the largest polar radius of any filter coil element. This requires far more separation between main coils (which are the principle source of perturbing fields) and the correction coils than in existing designs. In general it does not appear to be practical to employ a set of filter coils, lying on the surface of a cylinder, if each coil creates and is coupled to a single spherical harmonic term of the expansion of the field.

However, it is not meant to be implied that filter coils based upon spherical harmonic series expansion can not be employed despite the technical difficulties described above. It is nonetheless possible that several such sets of coils, each acting on a different linear combination of spherical harmonic series components can function together to cancel each of several targeted harmonic terms. For high harmonic terms in the series where the level of the harmonic term expected is only barely large enough to require correction, adequate partial cancellation may be obtained.

Spherical harmonic expansions have long been employed in the NMR imaging arts to characterize the desired field and various perturbing fields. However, spherical harmonic expansions are not the only expansions which may be used to describe the field. In particular, as is seen above, the spherical harmonic expansion is not very convenient for the purpose of studying superconducting filter coil circuits. It is seen below that an analysis in terms of Bessel functions permits the identification of an idealized filter system on the surface of the cylinder which is just as effective in the idealized form as the one used on the windings on the surface of a sphere. The idealized system proposed here requires infinitely permeable end caps on the cylinder. Such end caps are seen as metal discs $11a$ and $11b$ in FIG. 2. However, the deviation from ideal performance which occurs when this end-cap condition is removed, can be calculated by the superposition of several series of Bessel function field solutions. This second idealized system represents the best performance which can be achieved by a set of filter coils comprising circular filaments (windings) laying on the surface of a cylinder. The error field of this second idealized system is computed knowing only the radial field as a function of radius for the imposed field on the end plane. In this sense, the response of the system is source-independent.

In the analysis of the idealized system of the present invention, evaluation is made of the error field for the main coil set. The error field and surface current distribution of the idealized system also permits design of simplified realizations and also serves as a bench mark against which to evaluate their effectiveness.

For simplicity, the discussion immediately below is limited to axisymmetric fields. The first stage of the discussion below is further limited to fields with even symmetry with respect to the z-axis. The extension to odd symmetry follows immediately from the development herein. The axisymmetric restriction is relaxed below, after the even-symmetry axisymmetric case is considered.

Figure 1:
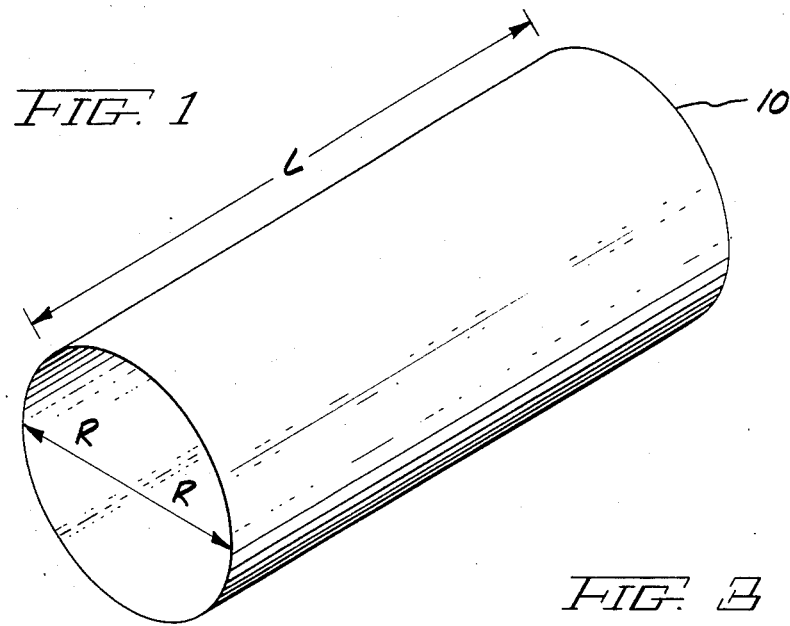
FIG. 1 is an isometric view illustrating a cylindrical volume of length L and radius R, useful for understanding field expansions in terms of cylindrical coordinates.
Figure 3:
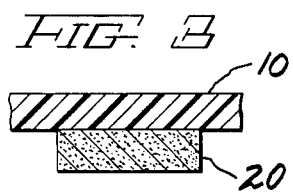
FIG. 3 is a cross-sectional side elevation view illustrating in detail a cross-section through a filter coil winding and a portion of the cylindrical support form.

Subject to these considerations, the following potential function:

$$V_1 = -B_o z - \frac{L}{2\pi} \sum_{m=1}^{\infty} \frac{A_m}{m} I_0(2\pi m\rho/L) \sin(2\pi mz/L), \quad (1)$$

represents a family of physically admissible fields in a cylinder of radius R and length L. See, for example, FIG. 1. In Equation (1), $I_0$ is a Bessel function of the second kind of order zero. The first term in Equation (1) is the term responsible for the desired uniform field. All of the remaining terms represent errors or perturbing fields.

The fields described by Equation (1) have the property that $B_\rho \rho 0$ at $z = \pm L/2$. Thus the potential function $V_1$ of equation (1) represents fields in a cylinder with infinitely permeable end caps, such as those approximated by the end caps shown (for illustration) in FIG. 2. However, since the construction of filter coils in accordance with the present invention requires a more general case, a field potential in which both radial and axial fields exist at the end of the cylinder is desired. The potential function:

$$V_2 = -\sum_{n=1}^{\infty} \frac{C_n}{c_n} J_0(c_n\rho) \sinh(c_n z), \quad (2)$$

represents a second physically admissible family of potential functions. In Equation (2) above, $J_0$ represents a Bessel function of the first kind, zeroeth order. In particular, in Equation (2), there are several choices for $c_n$ which provide useful results. In particular, $c_n$ is chosen to be an increasing sequence of values in which the following relationship holds:

$$\int_O^R \rho J_0(c_n\rho) \, d\rho = 0 \quad (3)$$

With this choice of values for $c_n$, the flux linkage of any field in the family of circular current loops on the surface of the cylinder is zero. Equation (3) is satisfied if:

$$\frac{R}{c_n} J_1(c_n R) = 0 \quad (4)$$

This equation is satisfied if $c_1 R, c_2 R, c_3 R, \ldots$ are the zeros of the function $J_1$, the Bessel function of the first kind, first order. If the coefficients $c_n$ are chosen in accordance with Equation (4), the functions $J_0(c_n\rho)$ are orthogonal on the circular interval from O to R, that is:

$$\int_O^R \rho \, J_0(c_n\rho) \, J_0(c_m\rho) \, d\rho = \begin{cases} 0 & n \neq m \\ \frac{R^2}{2} J_0^2(c_n R) & n = m. \end{cases} \quad (5)$$

Likewise the functions $J_1(c_n\rho)$ for $n = 1, 2, 3, \ldots$ are orthogonal.

The potential function $V_1$ is in the form of a Fourier series in z on the cylindrical surface. The potential $V_2$ is an expansion in orthogonal functions on the end planes. A superposition of these two potential functions should be sufficient to match any well behaved and appropriately symmetric potential on the boundary of the cylinder. Thus any field which may exist within the volume due to sources on the surface of or outside the volume may be described by a superposition of these two series. In particular, a new superposition potential $V = V_1 + V_2$ is defined so that:

$$V = -B_0 z - \frac{L}{2\pi} \sum_{m=1}^{\infty} \frac{A_m}{m} I_0(2\pi m\rho/L) \sin(2\pi mz/L) \quad (6)$$

$$- \sum_{n=1}^{\infty} \frac{C_n}{C_n} J_0(c_n\rho) \sinh(c_n z).$$

Since V represents an admissible potential function, in the volume of interest, it is possible to derive an equation representing the z component of the magnetic field given by such a scalar function. This is given below:

$$B_z = B_0 + \sum_{m=1}^{\infty} A_m I_0(2\pi m\rho/L) \cos(2\pi mz/L) + \quad (7)$$

$$\sum_{m=1}^{\infty} C_n J_0(c_n\rho) \cosh(c_n z).$$

Likewise, the radial component of the magnetic field produced by such a scalar function is again simply derivable from equation (6) by a process of partial differentiation:

$$B_\rho = \sum_{m=1}^{\infty} A_m I'_0(2\pi m\rho/L) \sin(2\pi mz/L) + \quad (8)$$

$$\sum_{m=1}^{\infty} C_n J'_0(c_n\rho) \sinh(c_n z).$$

If a winding is distributed on the surface of a cylinder so that the current density is a cosine function in z then:

$$J = J_j \cos(2\pi jz/L), \quad (9)$$

where J is the current density and where $J_j$ is an amplitude factor associated with the $j^{th}$ harmonic of the cosine function. The total number of turns $N_j$ associated with this particular current density distribution is given below in Equation (10):

$$N_j = 2Ll/\pi \quad (10)$$

where l is the amplitude of the turns density function. For this current density, the turns density $n_j$ is given by the following equation:

$$n_j = (\pi N_j/2L) \cos(2\pi jz/L). \quad (11)$$

The flux linkage for this cosinusoidal winding associated with the field distribution $B_z(\rho, z)$ is defined as $\lambda_j$ which may be determined from the following equation:

$$\lambda_j = \int_{-L/2}^{+L/2} n_j \int_0^R 2\pi\rho \, B_z(\rho, z) \, d\rho \, dz \quad (12)$$

Because of the constraints imposed upon $c_n$ in Equation (4) above, and because of the form of the $B_z$ field given above in Equation (7), it is seen that the inner or $\rho$-integral in Equation (12) is zero for that portion of the series involving the $C_n$ coefficients. Furthermore, because of the orthogonality of the cosine functions in z, only one term survives the outer or z-integration of Equation (12). In particular, for $m \geq 1$ it is seen that $\lambda_j$ is given by Equation (13) below:

$$\lambda_j = (\pi A_j N_j L \, R/(4j)) I_1(2\pi jR/L) \quad (13)$$

where $A_j$ is a coefficient from Equation (7) and where $I_1$ is a Bessel function of the second kind, first order. If the amplitude of the $A_j$ coefficient is that which corresponds to 1 ampere in a coil having a $\cos(2\pi jz/L)$ distribution function, then $\lambda_j$ is the mutual inductance.

If iron end plates were present, as shown in FIG. 2, then the coefficients of the series in Equation (7) involving terms $C_n$ is zero. In this case the coil having a cosine $(2\pi jz/L)$ distribution is an example of a perfect filter coil. The only flux linked by the coil corresponds to the $A_j$ term in the remaining series and the magnitude of the field due to an induced current is at every point equal in magnitude and opposite in sign to the $A_j$ component of the applied distribution.

When there are no end plates present, Equation (13) still holds so that the current in the $j^{th}$ coil is the same as when there are iron ends and the $A_j$ term of the applied field, as above. However, the current in the $j^{th}$ coil produces a non-zero $C_n$ series and a complete $A_m$ series, not just an $A_j$ term. The unreducible residual error is then represented by the superposition of an infinite number of C-series, one being the C-series of the imposed field, and the rest comprising a C-series for each term in the A-series describing the correction coils.

To avoid confusion, the coefficients $A_m$ and $C_m$ are reserved for the purpose of characterizing and describing the imposed main magnetic field. The coefficients $D_m$ and $E_n$ are likewise reserved to describe corresponding values for the correction coil field. If one considers the case with a one ampere current in the $j^{th}$ cosinusoidal correction coil and no current in any of the other coils, then at $z = L/2$, one can write the expression for $B_\rho$ by integrating the equation for the field into a loop of wire of radius R.

From Smythe "Static and Dynamic Electricity", 3rd Ed. pg. 291, the field due to such a loop is given by the following equation:

$$dB_{\rho j} = \frac{\mu}{2} \frac{(z - L/2)}{\rho((R + \rho)^2 + (z - L/2)^2)^{\frac{1}{2}}} \left[ -K(k) + \frac{R^2 + \rho^2 + (z - L/2)^2}{(R - \rho)^2 + (z - L/2)^2} E(k) \right] \times \frac{N_j}{2L} \cos(2\pi jz/L) \, dz, \quad (14)$$

where:

$$k^2 = 4R\rho/[(R + \rho)^2 + (z - L/2)^2] \quad (15)$$

From the above $B_{\rho j}$ may be computed as follows:

$$B_{pj}(\rho, L/2) = \int_{-L/2}^{+L/2} dB_{pj} \qquad (16)$$

This function may be equated to the series expansion for $B_p$ as seen in Equation (8). In particular, it should be noted as $Z = \pm L/2$, all of the $D_m$ terms are zero so that:

$$B_{pj}(\rho, L/2) = \sum_{n=1}^{\infty} E_{nj} J_0'(c_n\rho) \sinh(c_n L/2). \qquad (17)$$

Using properties of Bessel functions, it is known that equation (17) can also be written in the following form:

$$B_{pj}(\rho, L/2) = - \sum_{m=1}^{\infty} E_{mj} J_1(c_m\rho) \sinh(c_m L/2) \qquad (18)$$

Both sides of Equation (18) may be multiplied by $\rho J_1(c_n\rho)$ and integrated from $O$ to $R$ thus resulting in the following:

$$\int_0^R B_{pj}(\rho, L/2) \rho J_1(c_n\rho) d\rho = +E_{nj}(R^2/2) J_0(c_n R) J_2(c_n R) \times \qquad (19)$$

$$\sinh(c_n L/2).$$

In Equation (19) all but the $n^{th}$ term has been eliminated by the orthogonality properties of the Bessel function. Thus equation (20) may be readily solved for $E_{nj}$ as follows:

$$E_{nj} = \frac{2}{R^2 J_0(c_n R) J_2(c_n R) \sinh(c_n L/2)} \int_0^R B_{pj} \rho J_1(c_n\rho) d\rho. \qquad (20)$$

Once the coefficients $E_{nj}$ have been determined, it is a relatively straight forward matter to determine the $D_m$ coefficients. First the field along the z-axis is determined for the case of a coil with a $\cos(2\pi jz/L)$ distribution. Again from Smythe, for such a coil it is seen that:

$$dB_{zj} = \frac{\mu}{2} \frac{R^2}{(R^2 + (z_1 - L)^2)^{3/2}} \frac{Nj}{2L} \cos(2\pi j z_1/L) dz_1 \qquad (21)$$

where, similar to the case above:

$$B_{zj}(z) = \int_{-L/2}^{+L/2} dB_{zj}. \qquad (22)$$

Equating this to the double infinite series expansion of Equation (7) evaluated at $\rho = 0$ provides the following results:

$$B_{zj}(z) = \sum_{m=0}^{\infty} D_{mj} \cos(2\pi m z/L) + \sum_{n=1}^{\infty} E_{nj} \cosh(c_n z). \qquad (23)$$

Both sides of equation (23) may be multiplied by $\cos(2\pi mz/L)$ and integrated from $-L/2$ to $+L/2$ to produce the following two equations, namely, Equation (24a) for the case for which $m=0$ and Equation (24b) for the case in which m is a positive, non-zero integer:

$$\int_{-L/2}^{+L/2} B_{zj}(z) dz = D_{0j} L + 2 \sum_{n=1}^{\infty} \frac{E_{nj}}{c_n} \sinh(c_n L/2), \qquad (24a)$$

$$\int_{-L/2}^{+L/2} B_{zj}(z) \cos(2\pi mz/L) dz = \frac{L}{2} D_{mj} + \qquad (24b)$$

$$2 \sum_{n=1}^{\infty} \frac{c_n(-1)^m E_{nj}}{c_n^2 + (2\pi m/L)^2} \sinh(c_n L/2)$$

From the two equations immediately above one may solve for $D_{0j}$ and $D_{mj}$ as follows:

$$D_{0j} = \frac{1}{L} \int_{-L/2}^{L/2} B_{zj}(z) dz - \frac{2}{L} \sum_{n=1}^{\infty} \frac{E_{nj}}{c_n} \sinh(c_n L/2) \qquad (25a)$$

$$D_{mj} = \frac{2}{L} \int_{-L/2}^{L/2} B_{zj}(z) \cos(2\pi mz/L) dz - \qquad (25b)$$

$$4 \sum_{n=1}^{\infty} \frac{1}{c_n L} \frac{(-1)^m E_{nj}}{1 + (2\pi m/c_n L)^2} \sinh(c_n L/2).$$

A disturbing field with a $\cos(2\pi jz/L)$ term will have that term cancelled by a cosine $(2\pi jz/L)$ winding. Terms with other periodicity in z are generated by the current in the $j^{th}$ winding as are terms of the form $\cosh(c_n z)$. These terms may increase or buck the corresponding terms in the disturbing field. If more than one $\cos(2\pi jz/L)$ winding is present, for different j, the windings act to cancel all of the m-terms for which windings are present. The remaining terms in the cosine series and the terms in the hyperbolic cosine series will have coefficients determined by the superposition of the effect of the current in each winding plus the effect of the disturbing field.

As the number of j-terms become large, the m-series is completely cancelled. This is the limit of performance of a filter made up of circular coils on the surface of the cylinder. At this point it is appropriate to consider some observations concerning the analogy between this condition and the case of perfectly conducting cylinder. A perfectly conducting cylinder carries currents sufficient to block all terms in the m-series, including the $m=0$ terms. The $m=0$ term contains the bulk of the useful uniform field in the expansion for the main coil. The ideal superconducting filter works on all terms for which $m \geq 0$, but have no $j=0$ winding. There is still an effect on the uniform field through the $D_{0j}$ terms, but the sum of these is expected to be acceptably small.

The discussion above has primarily been directed to correction filters operating on the axisymmetric components of the magnetic field in question. However, in general, the field error includes significant non-axisymmetric components. The non-axisymmetric field can be expanded into a series of potentials having a form very similar to Equations (1) and (2), with the zeroeth order Bessel functions replaced by appropriate higher order Bessel Functions, and with sine and cosine terms in the cylindrical harmonic angle $\phi$ multiplying the potentials. For example, the component of non-axisymmetric error having $\sin \phi$ dependence can be described by a set of potentials, as follows:

$$V_{11} = -\frac{L}{2\pi} \sum_{m=1}^{\infty} \frac{F_m}{m} I_1(2\pi m\rho/L) \sin(2\pi mz/L) \sin\phi \quad (26a)$$

$$V_{21} = -\sum_{n=1}^{\infty} \frac{G_n}{g_n} J_1(g_n\rho) \sinh(g_nz) \sin\phi \quad (26b)$$

These equations are readily seen to be analogous to Equations (1) and (2). The distribution of current on the surface of a cylinder which has properties in this case analogous to that of the (Co) sinusoidal current density in the axisymmetric case, exhibits a current density variation as a sinusoidal function in two dimensions as follows:

$$\vec{K} = \sum_{i=0}^{\infty} F_i \left\{ \begin{array}{c} \sin\phi \\ \cos\phi \end{array} \right\} \left\{ \begin{array}{c} \cos(2\pi iz/L) \\ \sin(2\pi iz/L) \end{array} \right\} i_z + \quad (27)$$

$$\frac{F_iL}{2\pi i} \left\{ \begin{array}{c} \cos\phi \\ -\sin\phi \end{array} \right\} \left\{ \begin{array}{c} \sin(2\pi iz/L) \\ -\cos(2\pi iz/L) \end{array} \right\} i_\phi$$

where the sine and cosine functions for both $\phi$ and $z$ may be selected to match the symmetry of the particular non-axisymmetric error component being matched. In general, all terms can be expected to be present. A given coil will nonetheless be specific in its action to cancel a specific term in the $F_m$ series, in a manner exactly analogous to the cancellation of a term of the $D_m$ series in the case of the axisymmetric field.

Such a coil design is illustrated in FIGS. 4 and 5. In particular, FIG. 4 illustrates a cylindrical coil form 12 on which saddle coils 25a, 25b, 25c and 25d are disposed. The saddle coils are disposed in locations so as to exhibit mirror image symmetry, with respect to their locations at least, with respect to planes, one of which passes through the axis of the coil form and the other of which is perpendicular to the coil form axis and which bisects it substantially in the middle thereof. A better appreciation of the design of coils 25a–d may be had through an examination of FIG. 5 in which the coils have been isomorphically mapped to a plane. In general the coils illustrated in FIG. 4 are fabricated as shown in FIG. 5 on a flexible substrate which is then wrapped around a cylindrical coil form of appropriate dimension. The dual mirror image symmetry with respect to the centers of each coil is more evident in FIG. 5. However, more importantly it is seen that the coils in this embodiment of the present invention are spirally wound but are wound so as to exhibit a sinusoidal variation in turns winding density in both the axial and circumferential directions. In FIG. 5 this variation exhibits itself as a variation in turns density with respect to the direction measured from the center of each spiral coil in the radial direction. In the situation in which filter coils of the present invention are employed to correct both axisymmetric and non-axisymmetric field inhomogeneities the non-axisymmetric correction coils (the saddle coils) are disposed on a separate coil form 12 which is disposed coaxially with respect to coil form 10. In short, one of these coil forms is easily seen to slip inside the other to provide an even greater improvement in field homogeneity.

The above presentation of the mathematical theory behind the development of the present invention provides an analysis suitable for the development of superconducting filter coils in a framework of relatively few practical restrictions. The most significant restriction in the development presented above involves the fact that the filter coils are constrained to lie substantially upon the cylindrical surface. With respect to the requirement that the currents flowing in the superconducting filter coil lie on the surface of the cylinder, this requirement also may be relaxed by applying the design criteria outlined herein to coils of different radii.

From the above, it may be appreciated that the present invention provides a means for substantially improving the uniformity of high strength magnetic fields. It is also seen that the present invention provides uniform fields which are useful in NMR imaging applications. It is further seen that the present invention provides filter coils comprising specially designed superconducting current loops which do not require separate power supplies and which operate to automatically correct errors occurring in field uniformity.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A magnet for producing a high homogeneity magnetic field, especially in a cylindrical volume, said magnet comprising:
   a set of main coils disposed so as to produce a substantially uniform magnetic field within said volume; and
   at least one short-circuited superconductive filter coil disposed substantially on the surface of a cylindrical support, substantially coaxially with said main coil set and exhibiting sinusoidal variation in turns density, at least in the axial direction.

2. The magnet of claim 1 in which said main coils are superconductive.

3. The magnet of claim 1 in which said at least one filter coil comprises a plurality of filter coils which are disposed so as to reduce a specific group of terms in an orthogonal function expansion series representing deviation from magnetic field uniformity.

4. The magnet of claim 3 in which said plurality of filter coils are disposed so as to reduce a specific group of terms in a cylindrical function expansion series representing deviation from magnetic field uniformity.

5. The magnet of claim 1 in which said at least one filter coil is axisymmetric and which at least the $j^{th}$ of any of said axisymmetic filter coils present is disposed so that the surface turns density associated with said $j^{th}$ axisymmetric filter coil is substantially given by $n_j = l_j \cos(2\pi jz/L)$, where $l_j$ is a constant for the $j^{th}$ coil, L is the axial length of said $j^{th}$ coil and z is a measure of distance in the axial direction, $z=0$, corresponding to a plane perpendicular to the axis of said cylinder and passing through the central region of said cylindrical volume.

6. The magnet of claim 1 in which said at least one filter coil is disposed so as to reduce a single term in the cylindrical expansion series representing deviation from magnetic field uniformity within said cylindrical volume.

7. The magnet of claim 1 in which said at least one filter coil comprises a saddle coil set including an even number of coils.

8. The magnet of claim 7 in which said saddle coil set comprises spirally wound coils exhibiting sinusoidal variation in turns density in both the axial and circumferential directions.

9. The magnet of claim 7 in which said even number is 4.

10. The magnet of claim 9 in which said set of four spirally wound coils exhibit mirror image symmetry, with respect to their location, about two orthogonal planes, one of which includes the cylindrical axis, the other of which bisects said axis at the midpoint of said cylinder.

11. A filter coil, especially for correcting spatial magnetic field inhomogeneities in superconductive magnet structures, said coil comprising:
 a cylindrical coil form;
 at least one short-circuited axisymmetric super conductive filter coil disposed substantially on the surface of said coil form, in which at least the $j^{th}$ of said coils is disposed so that the surface turns density associated with said $j^{th}$ filter coil is substantially given by $n_j = l_j \cos(2\pi j z/L)$, where $l_j$ is a constant for the $j^{th}$ coil, L is the axial length of said $j^{th}$ coil and z is a measure of distance in the axial direction.

12. A filter coil, especially for correcting spatial magnetic field inhomogeneities in super conductive magnet structures, said coil comprising:
 a cylinder coil form;
 a set of four spirally wound saddle coils exhibiting a sinusoidal variation in turns density in both the axial and circumferential directions.

13. The filter coil of claim 12 in which said set of four spirally wound coils exhibit mirror image symmetry, with respect to their location, about two orthogonal planes, one of which includes the cylindrical axis the other of which bisects said axis at the midpoint of said cylinder.

14. A magnet for producing a high homogeneity magnetic field, especially in a cylindrical volume, said magnet comprising:
 a set of main coils, disposed so as to produce a substantially uniform magnetic field within said volume; and
 at least one short-circuited superconductive filter coil disposed so as to eliminate specified terms in an orthogonal series expansion representing deviation from magnetic field uniformity within said volume, said filter coil exhibiting sinusoidal variation in turns density, at least in the axial direction.

15. A filter coil, especially for correcting spatial magnetic field inhomogeneities in a superconductive magnet structure, said coil comprising at least one short-circuited superconductive filter coil disposed so as to eliminate specified terms in an orthogonal series expansion representing deviation from magnetic field uniformity within said volume, said filter coil exhibiting sinusoidal variation in turns density, at least in the axial direction.

16. A magnet for producing a high homogeneity magnetic field, said magnet comprising:
 a set of main coils disposed so as to product a substantially uniform magnetic field within a central volume defined by said main coils; and
 at least one superconductive filter coil capable of being short circuited, said coil being configured and disposed so as to reduce a single term in an orthogonal function expansion series representing deviation from magnetic field homogeneity within said volume.

* * * * *